(12) United States Patent
Gao

(10) Patent No.: US 11,910,575 B2
(45) Date of Patent: Feb. 20, 2024

(54) RACK SYSTEMS AND PACKAGING FOR SERVERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 125 days.

(21) Appl. No.: 17/465,177

(22) Filed: Sep. 2, 2021

(65) Prior Publication Data

US 2023/0067118 A1    Mar. 2, 2023

(51) Int. Cl.
| | |
|---|---|
| *H05K 7/20* | (2006.01) |
| *G06F 1/18* | (2006.01) |
| *H01R 13/00* | (2006.01) |
| *G01M 3/00* | (2006.01) |

(52) U.S. Cl.
CPC ......... *H05K 7/20781* (2013.01); *G06F 1/189* (2013.01); *H01R 13/005* (2013.01); *H05K 7/20272* (2013.01); *G01M 3/00* (2013.01); *G06F 1/188* (2013.01)

(58) Field of Classification Search
CPC ............ H05K 7/20781; H05K 7/20272; G06F 1/189; G06F 1/188; G06F 1/20; H01R 13/005; G01M 3/00
See application file for complete search history.

(56) References Cited

U.S. PATENT DOCUMENTS

| | | | |
|---|---|---|---|
| 7,318,322 B2 | 1/2008 | Ota et al. | |
| 9,661,777 B2 * | 5/2017 | Mills | H02B 1/26 |
| 10,133,698 B2 * | 11/2018 | Shao | G06F 13/102 |
| 10,785,892 B1 | 9/2020 | Chen et al. | |
| 11,231,756 B2 | 1/2022 | Nakamura | |
| 11,452,241 B2 * | 9/2022 | Tufty | H05K 7/20781 |
| 2004/0008483 A1 | 1/2004 | Cheon | |
| 2006/0203433 A1 * | 9/2006 | Peterson | H05K 7/1492 361/679.02 |
| 2007/0187343 A1 * | 8/2007 | Colucci | G06F 1/183 211/26 |
| 2013/0198534 A1 * | 8/2013 | Bailey | H02J 9/00 713/300 |
| 2014/0002988 A1 * | 1/2014 | Roesner | H05K 7/1489 361/679.49 |
| 2014/0078675 A1 * | 3/2014 | Chainer | H05K 7/20336 165/104.19 |
| 2014/0085821 A1 | 3/2014 | Regimbal et al. | |
| 2014/0247540 A1 * | 9/2014 | Steeves | H05K 13/04 174/68.2 |

(Continued)

*Primary Examiner* — Stephen S Sul
(74) *Attorney, Agent, or Firm* — WOMBLE BOND DICKINSON (US) LLP

(57) ABSTRACT

A source module includes a server fluid distribution unit and a busbar unit, as well as connectors. In an embodiment, a server fluid distribution unit to be coupled to a rack fluid distribution unit and the one or more server blades for deploying one or more servers. In an embodiment, a busbar unit to be coupled with an alternating current (AC) power distribution unit and the one or more server blades. In an embodiment, the source module is to be coupled to the rack fluid distribution unit to distribute cooling fluid received from a cooling fluid source to the one or more server blades of corresponding server chassis and to extract heat from the one or more servers.

18 Claims, 9 Drawing Sheets

(56) References Cited

U.S. PATENT DOCUMENTS

| | | | |
|---|---|---|---|
| 2016/0345459 A1* | 11/2016 | Mills | G06F 1/26 |
| 2017/0290202 A1 | 10/2017 | Shah | |
| 2017/0325358 A1 | 11/2017 | Franz et al. | |
| 2017/0339804 A1* | 11/2017 | Ingalz | H05K 7/20736 |
| 2018/0299933 A1 | 10/2018 | Cui et al. | |
| 2019/0044809 A1* | 2/2019 | Willis | G06F 9/5044 |
| 2019/0090383 A1* | 3/2019 | Tufty | H05K 7/20263 |
| 2019/0182990 A1 | 6/2019 | Chen et al. | |
| 2019/0335606 A1* | 10/2019 | James | H05K 7/1492 |
| 2020/0106297 A1* | 4/2020 | Ross | H05K 7/2079 |
| 2021/0307210 A1 | 9/2021 | Wong et al. | |
| 2021/0410336 A1* | 12/2021 | Yao | H05K 7/20736 |
| 2022/0240421 A1 | 7/2022 | Zhang et al. | |
| 2022/0354026 A1 | 11/2022 | Kelley et al. | |

\* cited by examiner

RACK SYSTEMS AND PACKAGING FOR SERVERS

FIELD OF THE INVENTION

Embodiments of the present invention relate generally to the electronics packaging, server and rack architecture, hardware design. More particularly, embodiments of the invention relate to rack systems and packaging for high power density servers.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

Heat removal is a prominent factor in a computer system and data center design. The number of high performance electronics components such as high performance processors packaged inside servers have steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

The previous rack solutions for blade servers are mainly air cooling based and using a power distribution solution for the power system. This solution may not be the most efficient solutions for servers for hyper scale applications.

With the increasing power densities of the electronics components such as artificial intelligence (AI) chips and accelerators, the server packaging densities are increasing as well. This means the server form factors may be decreased while the power densities increases. This means that more than one servers maybe populated in parallel on the rack, such as 1U2node, 1Uxnodes, 4U 4nodes, 4U 8nodes.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
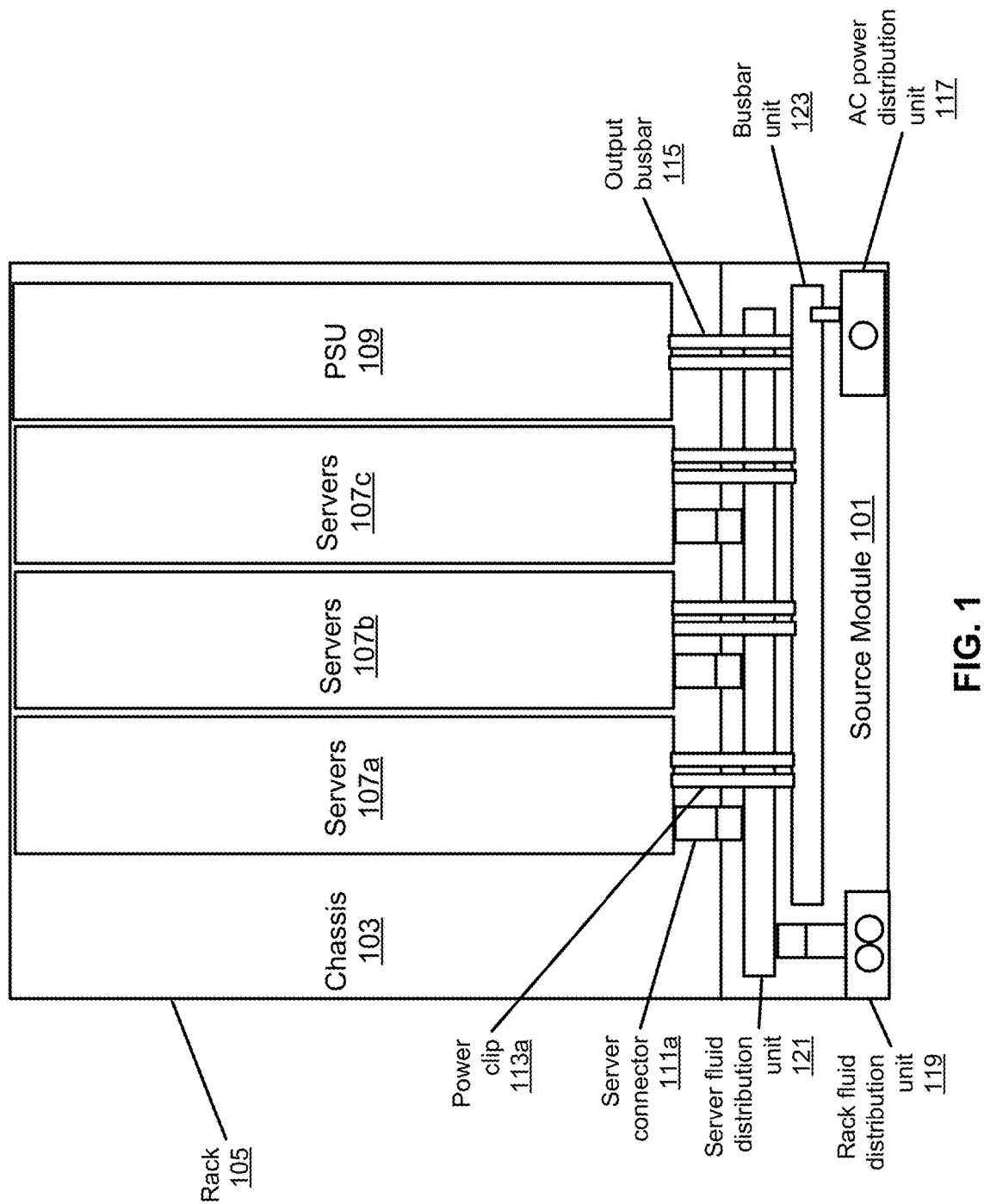
FIG. 1 shows a top view of a rack level system design according to an embodiment of the application.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The information technology (IT) hardware industry is a critical market for many reasons: it plays a crucial role in business competitiveness, service quality and availability, and also plays a significant role in the infrastructure total cost of ownership (TCO). IT hardware is closely linked with the profit of an organization. It is one of the core competencies of the internet giant, cloud computing service providers, as well as high performance computing and artificial intelligence (AI) computing related business service users and providers who build, operate, compute, store and manage other IT hardware platforms (e.g., servers) and infrastructures.

The majority of the hyper-scale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, interoperable and cost effective solutions and architectures.

The present disclosure aims to provide a rack system design for blade servers or high density systems which are populated parallel on a rack. This design aims to propose an advanced rack architecture and system for high power density servers, especially for the high power density blade servers. Further, this design includes the following design requirements for solutions to be deployed in hyper scale cloud data centers, such as: enable liquid cooling for high power blade servers; enable multiple rack power delivery design; enable central power distribution architected using busbar; accommodate existing data center cooling and power architectures; ease of implementations; high reliability; modular design to accommodate different blade server configurations; high scalability; and full serviceability of the entire solution.

The present application includes a rack main unit which is used for deploying the high power density servers. In an embodiment, the power distribution unit is also designed in the similar manner as high power density servers. For example, the individual servers include power connection clip and fluid connectors assembled on the rear side. In an embodiment, a source module (also referred to as a src module) is used on the rear side of the rack for connecting and distributing both fluid source and power source to the servers. For example, the source module includes server fluid distribution unit which includes both server connectors and rack connectors. In an embodiment, busbar unit is included in the source module. Further, for example, the one or more servers are connected with the source module including the fluid connectors and power connections. In an embodiment, the rack fluid distribution unit is designed and used on the rear side of the source module and an AC power distribution unit is added to the other side of the rear side of the source module.

According to one aspect, a source module includes a server fluid distribution unit and a busbar unit. In an embodiment, a server fluid distribution unit to be coupled to a rack fluid distribution unit and the one or more server blades for deploying one or more servers. In an embodiment, a busbar unit to be coupled with an alternating current (AC) power distribution unit and the one or more server blades. In an embodiment, the source module is to be coupled to the rack fluid distribution unit to distribute cooling fluid received from a cooling fluid source to the one or more server blades of corresponding server chassis and to extract heat from the one or more servers.

In an embodiment, each of the one or more server blades includes one or more power connection connectors (e.g., clips) to connect with the busbar unit. The busbar unit includes a power input connector to connect with the AC power distribution unit. In an embodiment, the source module is to be coupled to the AC power distribution unit connected with an AC source to distribute AC to a power supply unit (PSU). For example, the PSU includes a controller and a rectifier.

In an embodiment, the PSU is connected with the source module through a direct current (DC) output connector. The AC power distribution unit distributes the AC to the rectifier. In an embodiment, each of the one or more servers includes one or more sever fluid connectors to connect with the server fluid distribution unit.

In an embodiment, the server fluid distribution unit includes one or more server fluid connectors to connect with the one or more servers through the one or more server connectors. The server fluid distribution unit includes a rack connector to connect with the rack fluid distribution unit. In an embodiment, the rack fluid distribution unit includes rack fluid connectors to connect with the server fluid distribution unit through the rack connectors. The server fluid distribution unit is positioned underneath the busbar unit. A leak detection unit is positioned at a bottom side of the source module. The rack fluid distribution unit is attached onto the rear side of the source module. The AC power distribution unit is attached onto the rear side of the source module.

In an embodiment, the AC power distribution unit is on one side of the rear side of the source module and the rack fluid distribution unit is on the other side of the rear side of the source module. The server fluid distribution unit includes a rack connector on a first side facing the rack fluid distribution unit to connect with the rack fluid distribution connectors on the rack fluid distribution unit. The server fluid distribution unit includes one or more server connectors on a second side facing the one or more servers to connect with the one or more servers through corresponding one or more sever connectors.

According to another aspect, an electronic rack includes a rack fluid distribution unit, a power distribution unit (e.g., AC power distribution unit), a plurality of server chassis arranged in a stack, each server chassis to receive one or more server blades; and a plurality of source modules corresponding to the plurality of server chassis and positioned on a rear side of the electronic rack. In an embodiment, each source module may include components similar to the source module described above.

According to a further aspect, a data center cooling system includes a fluid supply line coupled to receive cooling fluid from a cooling fluid source, a fluid return line coupled to return the cooling fluid to the cooling fluid source, and a fluid return line coupled to return the cooling fluid to the cooling fluid source. Each of the plurality of electronic racks comprises a rack fluid distribution unit, a power distribution unit (e.g., AC power distribution), a plurality of server chassis arranged in a stack, each server chassis to receive one or more server blades; and a plurality of source modules corresponding to the plurality of server chassis and positioned on a rear side of the electronic rack. In an embodiment, each source module may be implemented as a source module described above.

FIG. 1 shows a top view of a rack level system design 100 according to an embodiment of the application. In particular, FIG. 1 shows the system design 100 when all components are assembled together. That is, the servers are assembled to the rack 105 and these are all IT units (e.g., 107, 109) including the servers (107*a*, 107*b*, 107*c*) and the PSU (109). In an embodiment, the servers (107*a*, 107*b*, 107*c*) include the fluid connectors (e.g., 111*a*) on the rear side. In an embodiment, the servers (107*a*, 107*b*, 107*c*) include the power connectors (e.g., 113*a*) on the rear side. The PSU (109) may include DC output connectors (e.g., 115) and AC input port.

In an embodiment, the server blades 107*a*, 107*b*, 107*c* and PSU blade 109 can be inserted into the corresponding slots of a server chassis, which can be inserted into racks 105 once they populated to rack 105. For example, source module 101 is the key unit in this design. In an embodiment, source module 101 includes power (e.g., 123) and fluid (e.g., 121) distribution components for distributing and delivering power and cooling source to the individual servers (107*a*, 107*b*, 107*c*). In an embodiment, the Source module 101 is then connected with a rear side assembled rack fluid distribution unit 119 and power distribution unit 117 (e.g., AC power distribution), which may be positioned in a vertical orientation to be connected to and to support multiple source modules associated with multiple server chassis.

In an embodiment, the overall design 100 can be understood as that the rack fluid distribution unit 119 and the power distribution unit 117 vertically distributing the sources (e.g., fluid source, power source) to the multiple source modules 101 and the source modules horizontally distributes the power and cooling source to individual blade nodes. It can be understood as that a two dimensional distribution system for both cooling and power using the current rack architecture 100. Again, the key module is the source module 101.

In an embodiment, a server chassis includes one or more server blades 107a, 107b, 107c connected with a source module 101. Source module 101 is positioned on a rear side of an electronic rack 105 for connecting the server chassis 103 for liquid cooling.

In an embodiment, source module 101 includes a server fluid distribution unit 121 to be coupled to a rack fluid distribution unit 119 and the one or more server blades 107a, 107b, 107c for deploying one or more servers. For example, the rack fluid distribution unit can be either a rack unit pre-mounted with the rack, or a unit post attached to the rack.

In an embodiment, a busbar unit 123 to be coupled with power distribution unit 117 and the one or more server blades 107a, 107b, 107c. Power distribution unit 117 may be configured to distribute AC power or DC power dependent upon the configuration of rack power distribution unit. In an embodiment, the source module 101 is to be coupled to the rack fluid distribution unit 119 to distribute cooling fluid received from a cooling fluid source to the one or more server blades 107a, 107b, 107c of corresponding server chassis (e.g., 103) and to extract heat from the one or more servers.

In an embodiment, a source module can be mounted on an electronic rack and includes a rack interface connected to rack manifolds via flexible hoses. The server side, the source module includes various server interfaces, such as blind mated dripless connectors, which can be used to connect with the cooling devices of server blades of a server chassis.

The cooling fluid is supplied to the cooling devices of a server blade via the server supply manifold of the corresponding source module. A cooling device can be a cold plate attached to an electronic device (e.g., a processor) to extract the heat generated from the electronic device. The cooling fluid carrying the extracted heat then exits the cooling devices of the server blade into the server return manifold of the source module.

Figure 2:
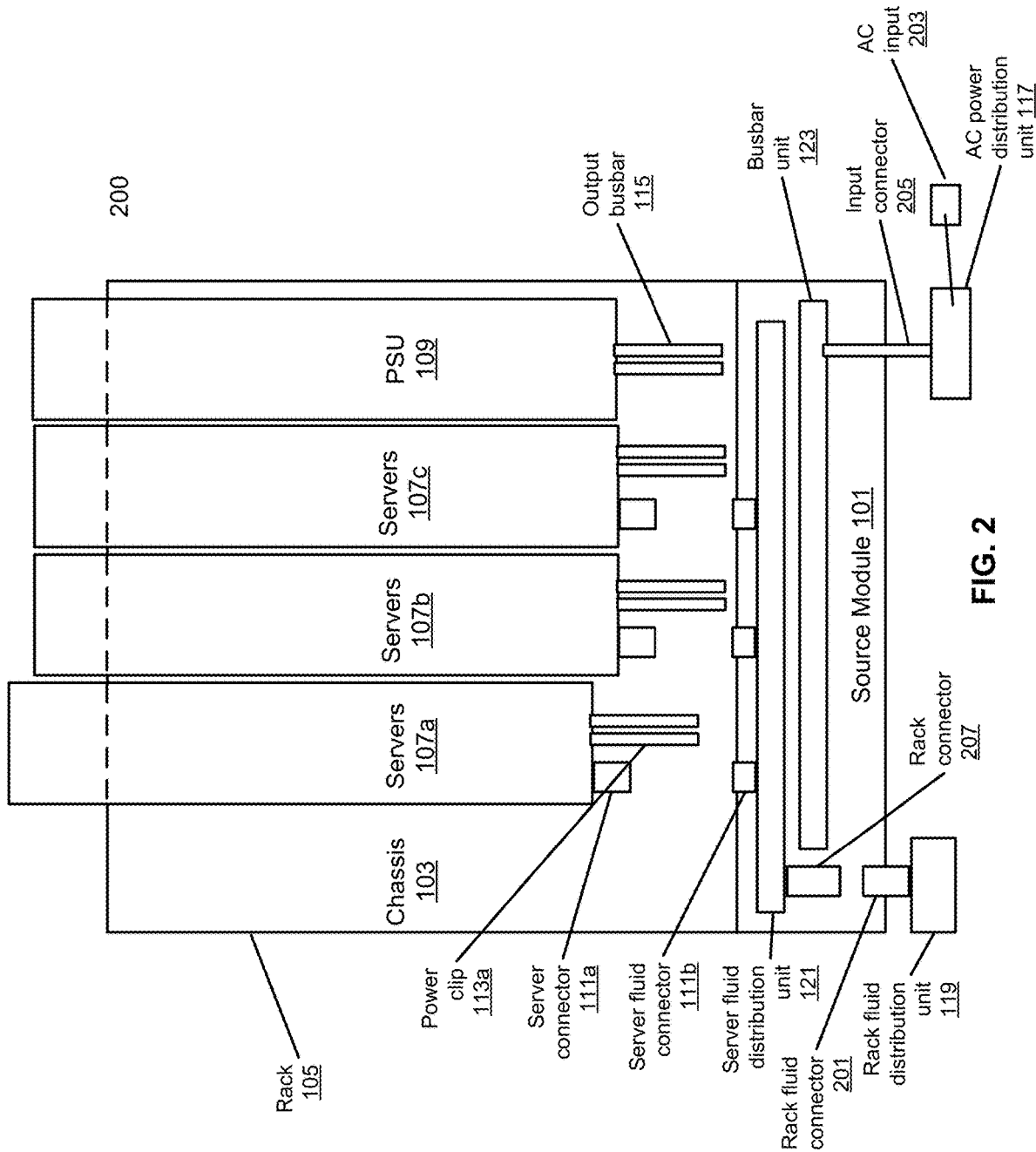
FIG. 2 shows a top view of a detailed rack level system design according to an embodiment of the application.

FIG. 2 shows a top view of a detailed rack level system design 200 according to an embodiment of the application. In particular, FIG. 2 provides a more detailed representation of the solution design 200 in each of the modules. For example, the servers 107a 107b, 107c are integrated to the racks 105 are blade nodes. In an embodiment, the PSU 109 is also designed and populated with the same manner.

In an embodiment, the source module 101 is the key unit used proposed in the architecture. For example, the design 200 includes a horizontal distribution unit (i.e., a server fluid distribution unit) 121 and the busbar unit 123 which are mainly for distributing the power sources. In an embodiment, the two units (121, 123) are designed to have the busbar unit 123 on top of the distribution unit 121. The actual relative position in each dimension can be different. The horizontal distribution unit 121 includes connectors (111b, 201) on both sides. For example, on one side, which is facing the servers 107, are the server fluid connectors (e.g., 111a). These connectors (e.g., 111a) are used for connecting with the ones on the servers 107. The rack fluid connectors 201 is on the other side.

In an embodiment, a rack fluid vertical distribution unit 119 is attached onto the rear side of the source module 101. For example, the rack fluid connectors (e.g., 201) are on the rack fluid vertical distribution unit 119 and designed to be connected with the rack connectors 207 in the source module 101. The power distribution unit 117 is attached onto the source module 101 or integrated to the rear side of the rack 105 which is used for connecting to the facility AC source and distributing AC to each PSU 109. In an embodiment, the output busbar connector 115 on the PSU connects to the individual busbar in the source module 101. The input connectors 205 on the AC distribution unit 117 are used to plug into the PSU AC input 203. It needs to be mentioned that the 119 and 117 are extended to the exterior of the rack, this is for illustration purpose. These two unit will be included within the rack once fully attached to the rack and connected with the source module.

In an embodiment, each of the one or more server blades 107a, 107b, 107c includes one or more power connectors or connection clips (e.g., 113a) to connect with the busbar unit 123. In an embodiment, the busbar unit 123 includes a power input connector 205 to connect with the power distribution unit 117. In an embodiment, the source module 101 is to be coupled to the power distribution unit 117 connected with a power source such as an AC source 203 to distribute power to a power supply unit (PSU) 109.

Figure 3:
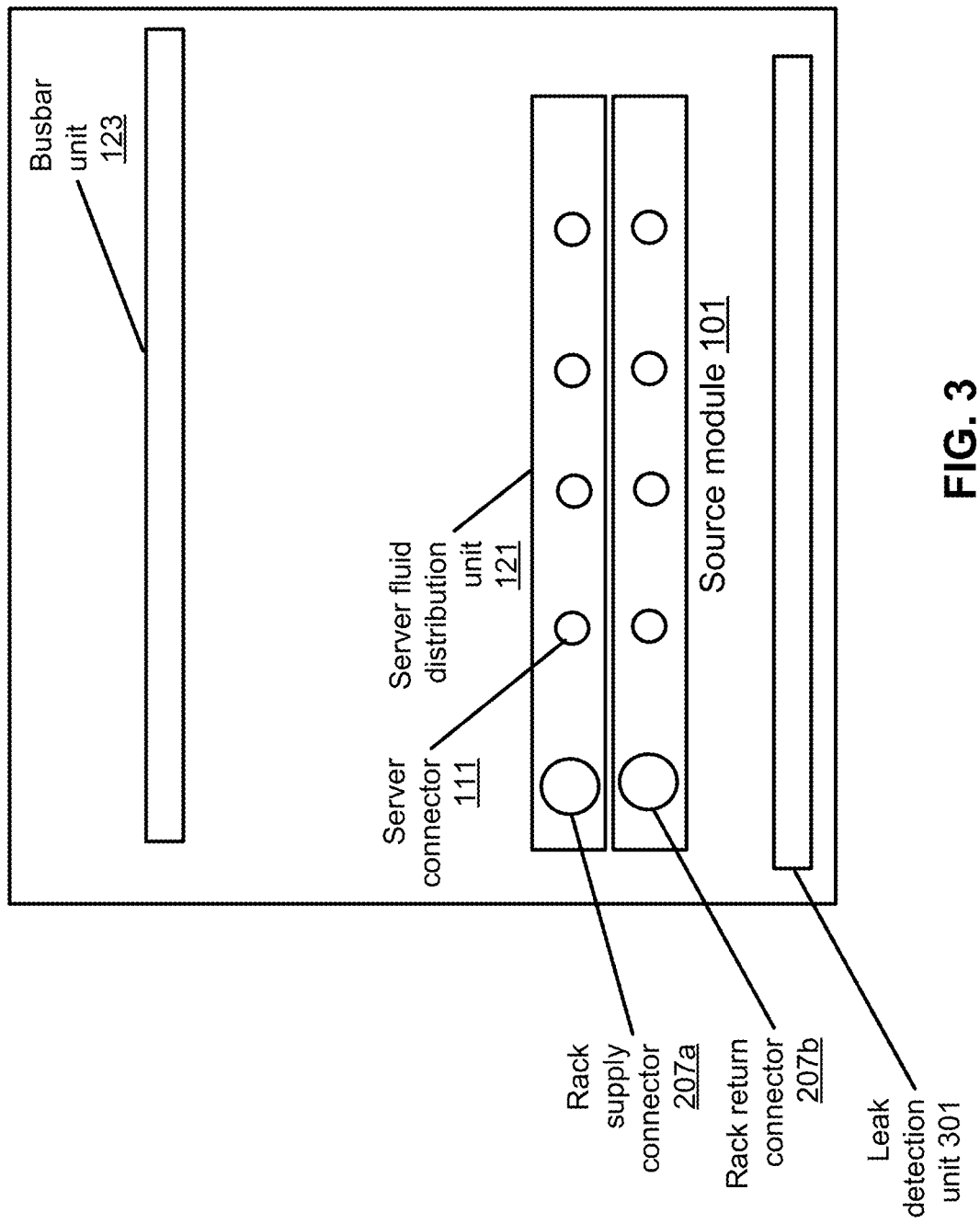
FIG. 3 shows a source module design according to an embodiment of the application.

In an embodiment, the rack fluid distribution unit 119 is attached onto the rear side of the source module 101. The power distribution unit 117 is attached onto the rear side of the source module 101. The power distribution unit 117 is on one side of the rear side of the source module 101 and the rack fluid distribution unit 119 is on the other side of the rear side of the source module 101. In an embodiment, the server fluid distribution unit 121 includes a rack fluid connector 201 on a first side facing the rack fluid distribution unit 119 to connect with the rack fluid distribution unit 119. In an embodiment, the server fluid distribution unit 119 includes one or more server connectors 111a on a second side facing the one or more servers 107 to connect with the one or more servers 107 through corresponding one or more sever fluid connectors 111a, 111b. FIG. 3 shows a source module design 300 according to an embodiment of the application. In particular, FIG. 3 shows the source module design 300 and it can be seen that the key units packaged are busbar 123 and horizontal distribution unit 121. In an embodiment, the distribution unit 121 includes connectors 111, 201 on both sides to connect with different hardware. In an embodiment, the bottom of the module 101 is fully contained to provide a full segregation of the full module with the others. In an embodiment, the busbar 123 is on top of the distribution unit 121 in one design 300. This enables more concept module designs to be developed.

In an embodiment, the rack connectors 207 is the connector for connecting with the rack fluid connectors 201 (in FIG. 2) on the rack fluid distribution unit 119. For example, the rack connectors (e.g., rack supply connector 207a, rack return connector 207b) may be packaged on different sides on the server fluid distribution unit 121. In an embodiment, server connectors 111 are packaged on the side facing the front where the servers being inserted.

In an embodiment, the leak detection unit can be added to the bottom side of the source module 101 for providing reliability and monitoring enhancement of the fluid system.

In an embodiment, the server fluid distribution unit 121 is positioned underneath the busbar unit 123. In an embodiment, a leak detection unit 301 is positioned at a bottom side of the source module 101.

Figure 4:
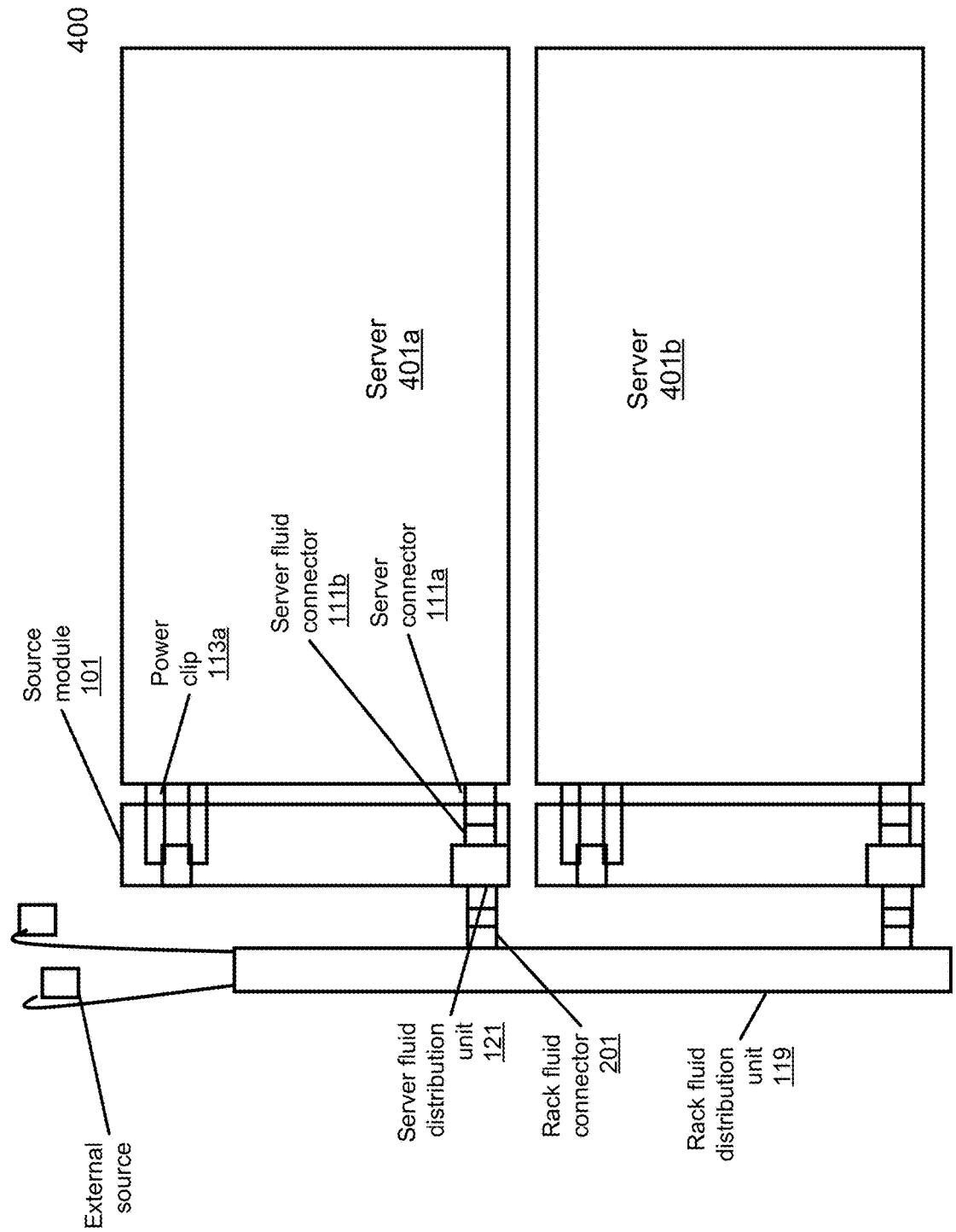
FIG. 4 shows a side view of system assembly for high power density servers according to an embodiment of the application.

FIG. 4 shows a side view of system assembly 400 for high power density servers according to an embodiment of the application. In particular, FIG. 4 shows the system detailed function and assembly. For example, the servers 401a, 401b are populated to the rack and connected with their respective source modules such as source module 101. In an embodiment, the top portions are the power connections 113*a* and the bottom portions are the fluid connections 111*a*. In an embodiment, the power connection includes the power clip 113*a* connecting with the busbar. In an embodiment, the fluid connection includes server connector 111*a* and server fluid connector 111*b* connection. In an embodiment, on the other side of the source module 101 is the connections with the rack vertical distribution unit 119. In an embodiment, the vertical distribution unit 119 is connecting with the horizontal distribution unit 121 in the source module 101 through the connections the rack connector I and II (e.g., 201).

Although there are two server chassis as shown, more server chassis can be mounted in an electronic rack. Each server chassis includes multiple slots to receive respective server blades. Each server blade includes electronic devices mounted on a motherboard, such as, for example, a processor, memory, peripheral devices, etc., representing one or more servers. At least some of the electronic devices, when operate, generate heat. Such heat generating devices may be attached to a cooling device such as a cold plate, which may be coupled to a source module mounted near the rear end of the server blade for liquid cooling as described above.

Figure 5:
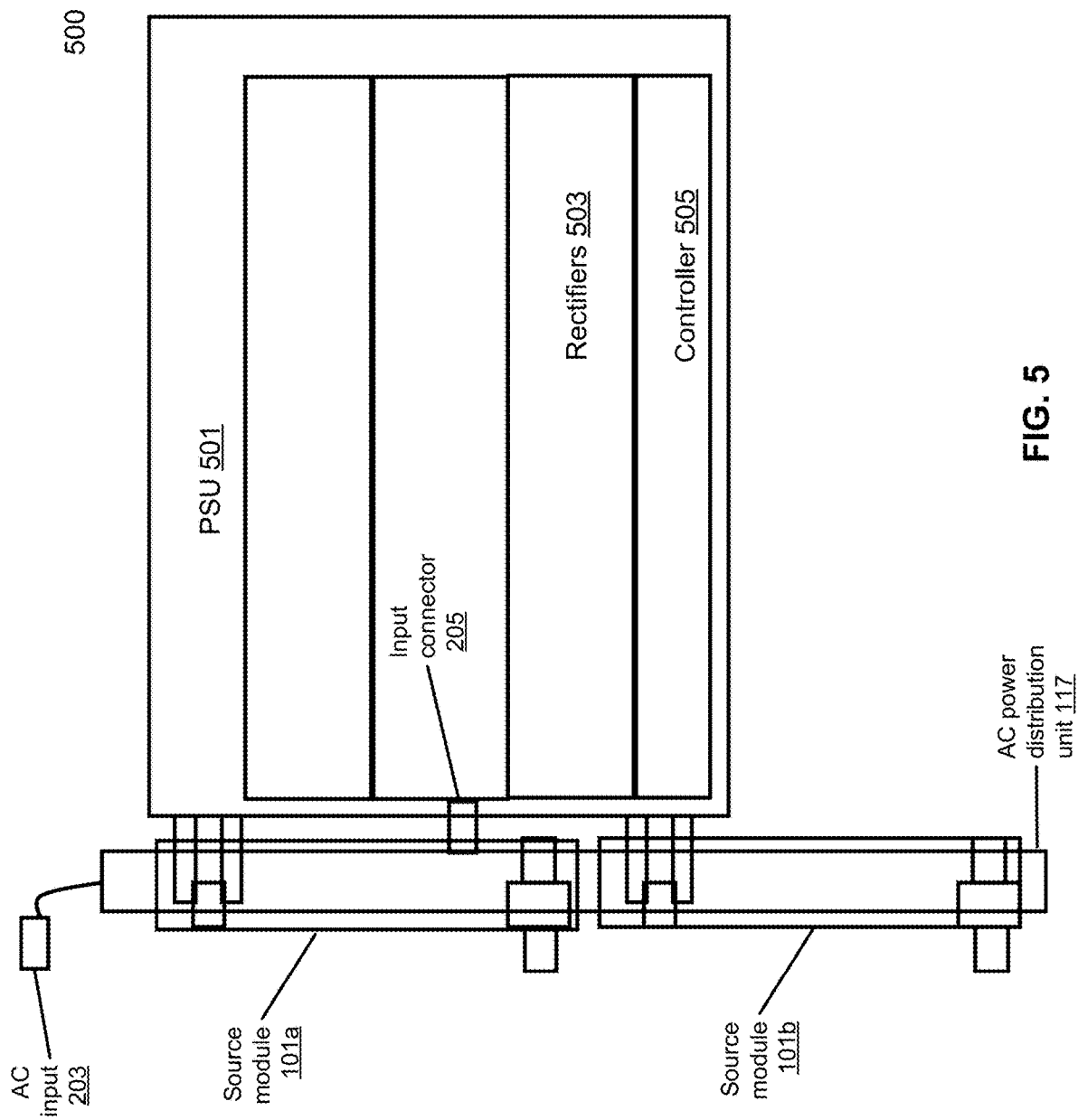
FIG. 5 shows a side view of system assembly for PSU according to an embodiment of the application.

FIG. 5 shows a side view of system assembly 500 for PSU according to an embodiment of the application. In particular, FIG. 5 shows the operation of the PSU 501. In an embodiment, the PSU 501 includes controller 505, rectifiers 503 inside and the PSU 501 is connected to the source module 101*a*, 101*b* through the DC output connectors, and there are multiple DC output connectors which means the PSU may be designed for serving several source modules 101*a*, 101*b*. In addition, in an embodiment, the input connectors 205 are the ones from the AC distribution unit 117 for distributing the AC source to the PSU 501 and the individual rectifiers 503.

In an embodiment, the power distribution unit 117 includes the input connectors 205 to be connected with the PSU input 123 and the AC input plug to be connected with the system AC input source. In an embodiment, the PSU 501 includes a controller 505 and a rectifier 503. In an embodiment, the PSU 501 is connected with the source module 101 through a DC output connector. In an embodiment, the AC power distribution unit 117 distributes the AC to the rectifier 503.

Figure 6A:
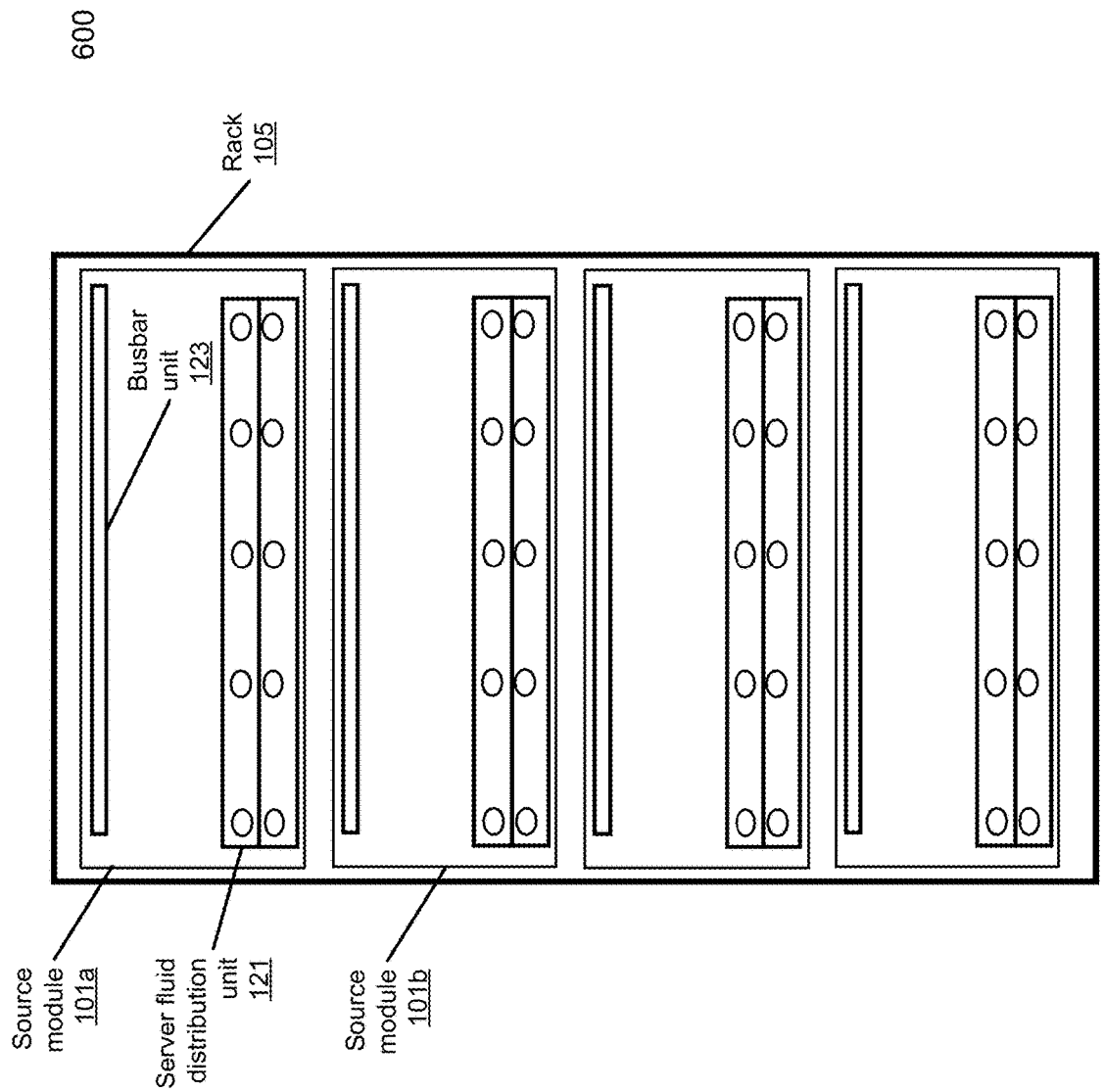
FIG. 6A shows a rear view of an example rack integrated with source modules according to an embodiment of the application.
Figure 6B:
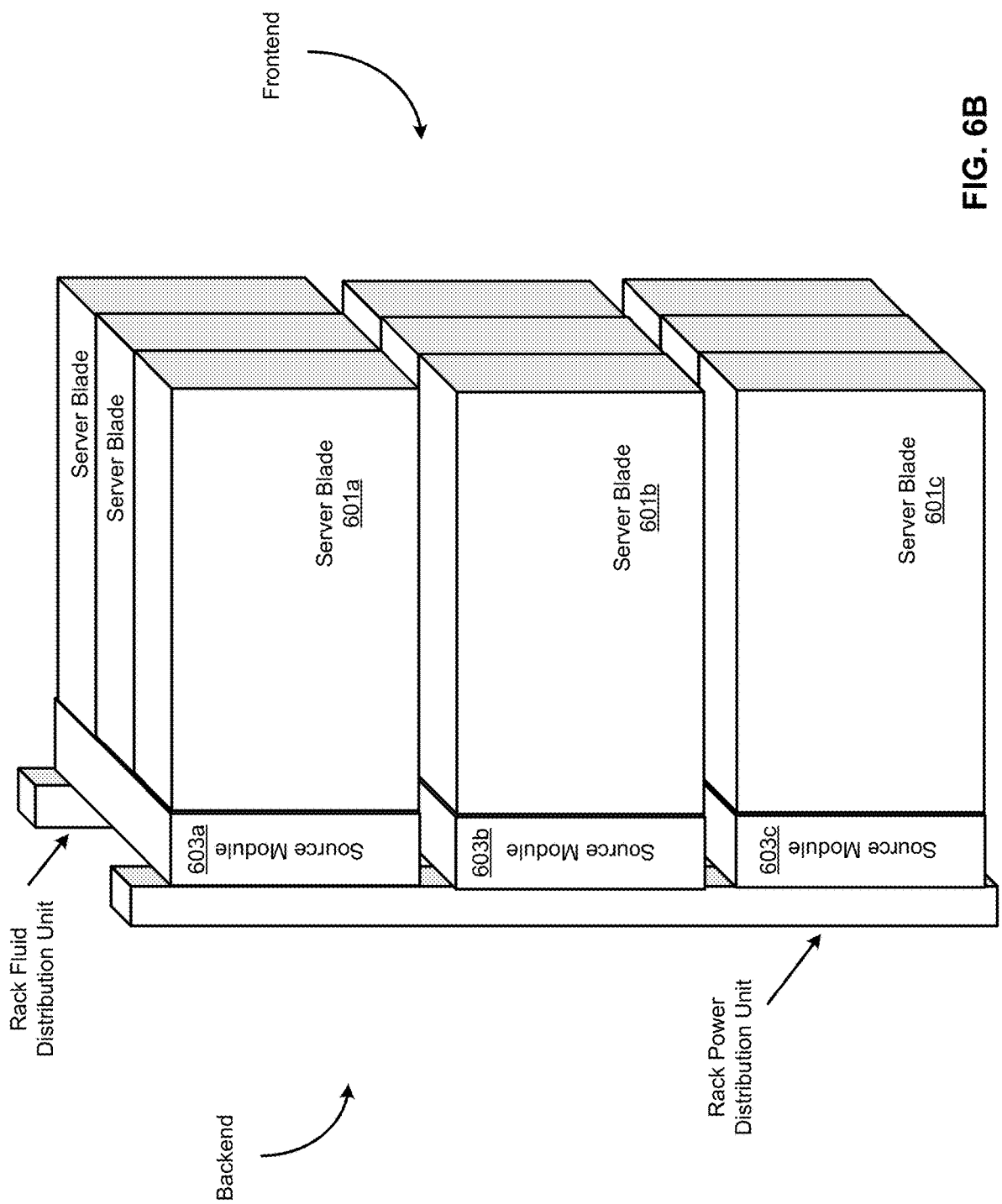
FIG. 6B shows a perspective view of an electronic rack according to an embodiment.

FIG. 6A shows an example rack 600 integrated with source modules 101*a*, 101*b* according to an embodiment of the application. In particular, FIG. 6B shows the rear side of the rack 105 when the sources modules 101*a*, 101*b* are assembled to the rack 105. In an embodiment, the individual source module 101*a*, 101*b* includes the key source distribution hardware and there are multiple such units used on the rack 105. In an embodiment, the source module 101*a*, 101*b* can be dynamically changed and different configurations can be used and coexist on a rack 105 based on the actual based system designs. The sizes and numbers can be flexible configured depending on the servers the rack will be receiving. The rack side design including the vertical fluid and AC source are kept the same.

FIG. 6B shows a perspective view of a system according to an embodiment of the application. In particular, FIG. 6B shows that a rack is populated with several groups of blade servers (601*a*, 601*b*, 601*c*) connected with their respective source modules (603*a*, 603*b*, 603*c*). In an embodiment, each group of blade servers (601*a*, 601*b*, 601*c*) is functioning with a respective source module. In an embodiment, the rack mounted fluid liquid supply and main return are added to the rear side of the racks once the source modules (603*a*, 603*b*, 603*c*) are populated. In an embodiment, the detailed operation may enable the blade servers (601*a*, 601*b*, 601*c*) to be installed and uninstalled from the rack without any impact on other systems.

In addition, a source module can be individually installed and uninstalled without any impact on the rack liquid supply and main return, since the connections are through flexible hoses. In an embodiment, the design enables an efficient control strategy on the fluid system since each of the individual source modules is separately controlled. In an embodiment, even though multiple source modules are sharing the rack liquid supply and main return manifolds, the individual controller (not shown) as well as the corresponding sensors input allows a robust localized control for groups of blade servers.

Figure 7:
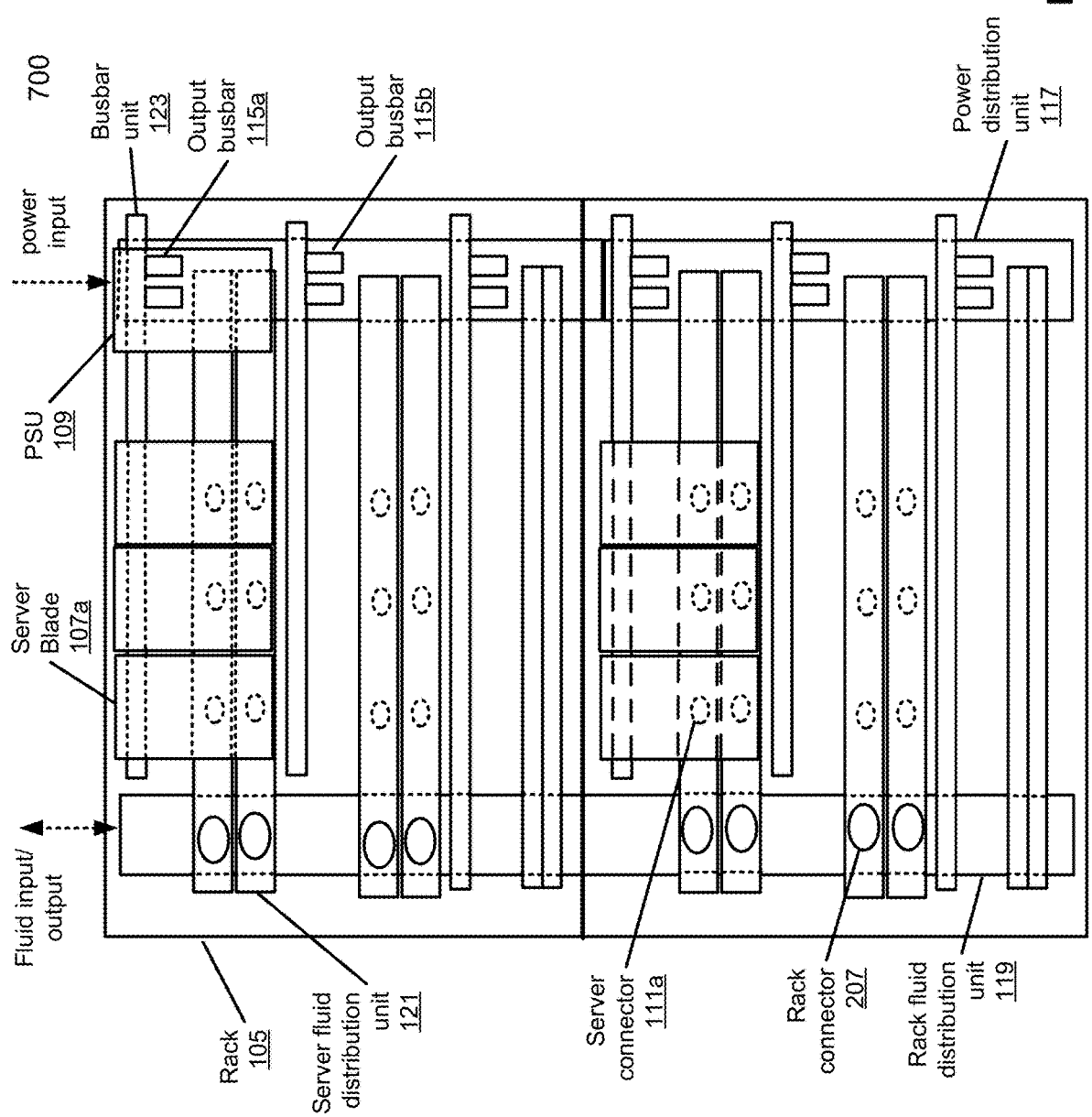
FIG. 7 shows an example rack fully integrated with source modules according to an embodiment of the application.

FIG. 7 shows an example rack 105 fully integrated with source modules according to an embodiment of the application. In particular, FIG. 7 shows the rack design 700 with the full solution integrated. For example, the rack 105 is not fully populated, and several servers (e.g., 107*a*) are populated. In an embodiment, several source modules are assembled onto the rack 105 and both the rack fluid distribution unit 119 and distribution unit 117 are integrated. In an embodiment, the top of the two distribution units is connected to the main facility source, cooling fluid system 121 and the AC power bus 123. In an embodiment, the source module receives the source (e.g., cooling liquid source) from the vertical mounted units 117, 119 and then horizontally distributes (through 121, 123) to the individual servers (e.g., 107*a*).

The current design 700 enables to operate all the power and cooling hardware and source from the rear side and it enables an efficient manner for distributing both cooling fluid source and AC source across the entire rack 105.

In an embodiment, each of the one or more servers 107*a* includes one or more sever fluid connectors 111*a* to connect with the server fluid distribution unit 121. In an embodiment, the server fluid distribution unit 121 includes a rack fluid connector 201 to connect with the rack fluid distribution unit 119.

Figure 8:
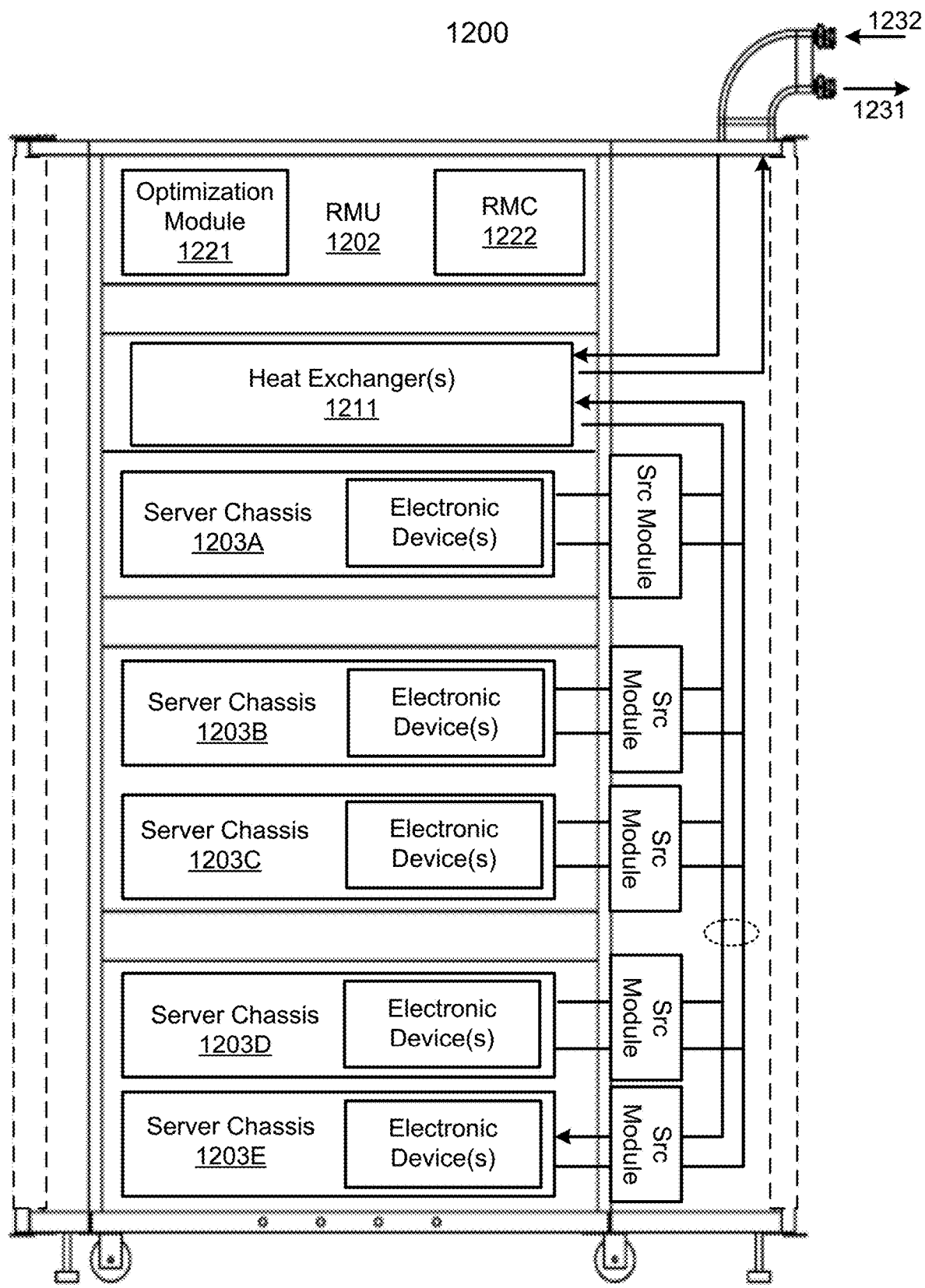
FIG. 8 is a block diagram illustrating an example of an electronic rack according to one embodiment.

FIG. 8 is block diagram illustrating an electronic rack according to one embodiment. Electronic rack 1200 may represent any of the electronic racks as described throughout this application. According to one embodiment, electronic rack 1200 includes, but is not limited to, heat exchanger 1211, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Each server chassis includes multiple blade slots to receive server blades. Each server blade includes server components representing one or more servers therein. Each of the server blade, when inserted, is coupled to a source module mounted on the rack near the backend of the server chassis and rack. The source module is then coupled to rack manifolds and the rack power distribution unit, as described above.

Note that although there are five server chassis 1203A-1203E shown here, more or fewer server chassis may be maintained within electronic rack 1200. Also note that the particular positions of heat exchanger 1211, RMU 1202, and/or server chassis 1203 are shown for the purpose of illustration only; other arrangements or configurations of heat exchanger 1211, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the backend of server chassis 1203 or on the electronic rack to generate airflows flowing from frontend 1204, traveling through the air space of the server chassis 1203, and exiting at backend 1205 of electronic rack 1200.

In one embodiment, heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to rack manifold 1225 to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to heat exchanger 1211. Note that heat exchanger 1211 can be any kind of heat exchangers commercially available or customized ones. Thus, the details of heat exchanger 1211 will not be described herein.

Each of server chassis 1203 may include one or more information technology (IT) components (e.g., electronic devices such as processors, memory, and/or storage devices). In one embodiment, in at least some of the server chassis 1203, an electronic device may be attached to a cold plate. The cold plate includes a liquid distribution channel to receive cooling liquid from the rack liquid supply line of rack manifold 1225. The cooling liquid performs heat exchange from the heat generated from the electronic device attached thereon. The cooling liquid carrying the exchanged heat is returned to the rack liquid return line of rack manifold 1225 and back to heat exchangers 1211.

In another embodiment, some of the server chassis 1203 may include an immersion tank containing immersion cooling liquid therein. The electronic devices of the corresponding server(s) are at least partially submerged into the immersion cooling liquid. The immersion cooling liquid may be dielectric cooling fluid, which may be circulated between the immersion tanks and heat exchanger 1211. The cooling liquid may be a single-phase cooling liquid or two-phase cooling liquid (also referred to as phase-change cooling liquid). The two-phase cooling liquid evaporates from a liquid form into a vapor form when the temperature of the cooling liquid is above a predetermined temperature threshold (e.g., the boiling point of the cooling liquid). The vapor flows upstream via the vapor line from the corresponding server chassis to heat exchanger 1211. Heat exchanger 1211 may include a condenser to condense the vapor from the vapor form back to the liquid form, where the cooling liquid is then supplied back to the server chassis.

Note that some of the server chassis 1203 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Rack manifold 1225 may include a first rack manifold for single-phase cooling and a second rack manifold for two-phase cooling to be coupled to the same or different server chassis for different types of cooling. Some of the server chassis 1203 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 1203 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 1200 further includes optional RMU 1202 configured to provide and manage power supplied to servers 1203 and heat exchanger 1211. RMU 1202 may be coupled to a power supply unit (not shown) to manage the power consumption of the power supply unit. The power supply unit may include the necessary circuitry (e.g., an AC to DC or DC to DC power converter, battery, transformer, or regulator, etc.,) to provide power to at least some of the remaining components of electronic rack 1200.

In one embodiment, RMU 1202 includes optional optimization module 1221 and rack management controller (RMC) 1222. RMC 1222 may include a monitor to monitor operating status of various components within electronic rack 1200, such as, for example, computing nodes 1203, heat exchanger 1211, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 1222 configures the liquid pump and cooling fans of the fan modules based on the optimal pump speeds and fan speeds.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A source module positioned on a rear side of an electronic rack for connecting a server chassis for liquid cooling, comprising:
    a server fluid distribution unit to be coupled to a rack fluid distribution unit and one or more server blades of the server chassis, the server fluid distribution unit including
        a server supply manifold to receive cooling fluid from the rack fluid distribution unit and to distribute the cooling fluid to the one or more server blades, and
        a server return manifold to receive the cooling fluid from the one or more server blades and to return the cooling fluid to the rack fluid distribution unit; and
    a busbar unit to be coupled with a power distribution unit and the one or more server blades, wherein the power distribution unit is to be connected with a power source through to distribute power to a power supply unit (PSU) contained within the server chassis, wherein the PSU is connected with the source module through a direct current (DC) output connector, the busbar unit including
        a rack power interface to be coupled to the power distribution unit to receive power, and
        a plurality of server power interfaces to distribute the power to the one or more server blades.

2. The source module of claim 1, wherein the server supply manifold comprises a rack supply connector to be connected to the rack fluid distribution unit and one or more server supply connectors to be connected to the one or more server blades, and wherein the server return manifold comprises a rack return connector to be connected to the rack fluid distribution unit and one or more server return connectors to be connected to the one or more server blades.

3. The source module of claim 1, wherein the server supply manifold and the server return manifold are position horizontally.

4. The source module of claim 1, wherein the source module is to be coupled to the power distribution unit.

5. The source module of claim 1, wherein the server fluid distribution unit is positioned underneath the busbar unit.

6. The source module of claim 1, further comprising a leak detection unit positioned at a bottom side of the source module.

7. The source module of claim 1, wherein the rack fluid distribution unit is attached onto a rear side of the source module.

8. The source module of claim 1, wherein the power distribution unit is attached onto a rear side of the source module.

9. The source module of claim 1, wherein the power distribution unit is on one side of a rear side of the source module and the rack fluid distribution unit is on another side of the rear side of the source module.

10. An electronic rack, comprising:
    a rack fluid distribution unit;
    a power distribution unit;
    a plurality of server chassis arranged in a stack, each server chassis to receive one or more server blades; and
    a plurality of source modules corresponding to the plurality of server chassis and positioned on a rear side of the electronic rack, each source module comprising:
        a server fluid distribution unit to be coupled to the rack fluid distribution unit and the one or more server blades of a server chassis, the server fluid distribution unit including
            a server supply manifold to receive cooling fluid from the rack fluid distribution unit and to distribute the cooling fluid to the one or more server blades, and
            a server return manifold to receive the cooling fluid from the one or more server blades and to return the cooling fluid to the rack fluid distribution unit; and
        a busbar unit to be coupled with the power distribution unit and the one or more server blades, wherein the power distribution unit is to be connected with a power source through to distribute power to a power supply unit (PSU) contained within the server chassis, wherein the PSU is connected with the source module through a direct current (DC) output connector, the busbar unit including
            a rack power interface to be coupled to the power distribution unit to receive power, and
            a plurality of server power interfaces to distribute the power to the one or more server blades.

11. The electronic rack of claim 10, wherein the server supply manifold comprises a rack supply connector to be connected to the rack fluid distribution unit and one or more server supply connectors to be connected to the one or more server blades, and wherein the server return manifold comprises a rack return connector to be connected to the rack fluid distribution unit and one or more server return connectors to be connected to the one or more server blades.

12. The electronic rack of claim 10, wherein the server supply manifold and the server return manifold are position horizontally.

13. The electronic rack of claim 10, wherein each source module of the plurality of source modules is to be coupled to the power distribution unit.

14. The electronic rack of claim 10, wherein a power source delivered to the power distribution unit is an AC power source.

15. The electronic rack of claim 10, wherein a power source delivered to the power distribution unit is a renewable power source.

16. The electronic rack of claim 10, wherein the server fluid distribution unit is positioned underneath the busbar unit.

17. The electronic rack of claim 10, wherein each source module further comprises a leak detection unit positioned at a bottom side of the source module.

18. A data center cooling system, comprising:
    a fluid supply line coupled to receive cooling fluid from a cooling fluid source;
    a fluid return line coupled to return the cooling fluid to the cooling fluid source; and a plurality of electronic racks coupled to the fluid supply line and the fluid return line, wherein each of the plurality of electronic racks comprises:
  a rack fluid distribution unit;
  a power distribution unit;
  a plurality of server chassis arranged in a stack, each server chassis to receive one or more server blades; and
  a plurality of source modules corresponding to the plurality of server chassis and positioned on a rear side of an electronic rack of the plurality of electronic racks, each source module comprising:
    a server fluid distribution unit to be coupled to the rack fluid distribution unit and the one or more server blades of a server chassis of the plurality of server chassis, the server fluid distribution unit including
      a server supply manifold to receive the cooling fluid from the rack fluid distribution unit and to distribute the cooling fluid to the one or more server blades, and
      a server return manifold to receive the cooling fluid from the one or more server blades and to return the cooling fluid to the rack fluid distribution unit; and
    a busbar unit to be coupled with the power distribution unit and the one or more server blades, wherein the power distribution unit is to be connected with a power source through to distribute power to a power supply unit (PSU) contained within the server chassis, wherein the PSU is connected with the source module through a direct current (DC) output connector, the busbar unit including
      a rack power interface to be coupled to the power distribution unit to receive power, and
      a plurality of server power interfaces to distribute the power to the one or more server blades.

* * * * *